United States Patent [19]

Inoue et al.

[11] Patent Number: 5,434,441
[45] Date of Patent: Jul. 18, 1995

[54] SILICON-ON-INSULATOR CMOS DEVICE AND A LIQUID CRYSTAL DISPLAY WITH CONTROLLED BASE INSULATOR THICKNESS

[75] Inventors: Shunsuke Inoue; Toru Koizuki, both of Yokohama; Mamoru Miyawaki, Isehara; Shigetoshi Sugawa, Atsugi, all of Japan

[73] Assignee: Canon Kabushiki Kaisha, Tokyo, Japan

[21] Appl. No.: 285,535

[22] Filed: Aug. 4, 1994

Related U.S. Application Data

[63] Continuation-in-part of Ser. No. 274,156, Jul. 14, 1994, which is a continuation of Ser. No. 10,438, Jan. 28, 1993, abandoned.

[30] Foreign Application Priority Data

Jan. 31, 1992 [JP] Japan .................. 4-040496

[51] Int. Cl.⁶ .................. H01L 27/01; H01L 27/13
[52] U.S. Cl. .................. 257/347; 257/349; 257/351; 257/352; 359/59
[58] Field of Search .................. 257/347, 349, 351, 352; 359/54, 59

[56] References Cited

U.S. PATENT DOCUMENTS

| 4,907,053 | 3/1990 | Ohmi | 257/347 |
| 5,060,035 | 10/1991 | Nishimura et al. | 257/351 |
| 5,225,356 | 7/1993 | Omura et al. | 257/347 |
| 5,233,207 | 8/1993 | Anzai | 257/351 |
| 5,241,211 | 8/1993 | Tashiro | 257/347 |

FOREIGN PATENT DOCUMENTS

| 61-94367 | 5/1986 | Japan | 257/347 |
| 2-25821 | 6/1987 | Japan | 257/347 |
| 2-25067 | 1/1990 | Japan | 257/347 |
| 3-105976 | 5/1991 | Japan | 257/349 |

*Primary Examiner*—William Mintel
*Assistant Examiner*—Minhloan Tran
*Attorney, Agent, or Firm*—Fitzpatrick, Cella, Harper & Scinto

[57] ABSTRACT

A semiconductor device has an NMOS transistor and a PMOS transistor formed on at least one monocrystal Si region formed in a thin-film Si layer formed on an insulation layer. The thickness $T_{BOX}$ of the insulation layer on which the NMOS and PMOS transistors are formed, the voltage $V_{SS}$ of a low-voltage power supply and the voltage $V_{DD}$ of a high-voltage power supply for the NMOS and PMOS transistors satisfy a relationship expressed by the following inequality:

$$T_{BOX} > (V_{DD} - V_{SS} - K_2)/K_1$$

where $K_1 \equiv \epsilon_{BOX}^{-1}(Q_{BN} + Q_{BP})$, $K_2 \equiv \phi_{FN} + \phi_{FP}$, $\epsilon_{BOX}$ is the dielectric constant of the base insulation layer, $Q_{BN}$ and $Q_{BP}$ are bulk charges when the widths of depletion layers of the NMOS and PMOS transistors are maximized, and $\phi_{FN}$ and $\phi_{FP}$ are pseudo Fermi potentials of the NMOS and PMOS transistors.

9 Claims, 11 Drawing Sheets

FILM THICKNESS-THRESHOLD VALUE
CHARACTERISTICS OF PARASITIC NMOS

SILICON-ON-INSULATOR CMOS DEVICE AND A LIQUID CRYSTAL DISPLAY WITH CONTROLLED BASE INSULATOR THICKNESS

This application is a continuation-in-part of application Ser. No. 08/274,156, filed Jul. 14, 1994, which is a continuation of application Ser. No. 08/010,438, filed Jan. 28, 1993, now abandoned.

BACKGROUND OF THE INVENTION

1. Field of the Invention

This invention relates to a semiconductor device having a P-channel metal oxide silicon (PMOS) transistor and an N-channel metal oxide silicon (NMOS) transistor and to a liquid crystal display using the semiconductor device as a peripheral drive circuit and the MOS (PMOS or NMOS) transistor as a pixel electrode switching device.

2. Description of the Related Art

With the recent rapid progress of semiconductor technology, there has been a demand for smaller, high-speed and small-power-consumption semiconductor devices and apparatuses using such devices. The development of complementary MOS (CMOS) inverters using P-channel and N-channel enhancement type MOS field effect transistors (FET) as load and inverter devices among such apparatuses is being further promoted because the power consumption of this type of inverter is very small, although a complicated manufacturing process is required.

FIG. 1(a) shows an example of a CMOS inverter in section. A transistor 16 is an NMOS transistor while a transistor 17 is a PMOS transistor. The transistors 16 and 17 are formed on a substrate while being insulated by a base insulation layer 2 and separated from each other by SiO$_2$ 3. The MOS transistor 16 is constituted of an N+ drain 5, a P-channel region 10, an N-type field limiting regions 12, 12', a gate insulation film 8, a gate electrode 9, a source electrode 14, and a drain electrode 15. The gate electrode is ordinarily formed of a polycrystalline Si, and the source and drain electrodes are formed of Al.

The PMOS transistor 17 is constituted of a P+ drain 6, a P+ source 7, N-channel region 11, a P-type field limiting regions 13, 13', a gate insulation film 8', a gate electrode 9', a source electrode 14', and a drain electrode 15'.

FIG. 1(b) is an equivalent circuit diagram of the above-described CMOS inverter. As illustrated, the drain electrode 15 of the NMOS transistor 16 and the drain electrode 15' of the PMOS transistor 17 are connected to a common output electrode. An output voltage at this output electrode is represented by $V_{out}$. The source electrode 14 of the NMOS transistor 16 is connected to a low-voltage power supply, while the source electrode 14' of the PMOS transistor 17 is connected to a high-voltage power supply. The voltages of these power supplies are represented by $V_{SS}$ and $V_{DD}$. The substrate 1 forms gate electrodes of parasitic MOS transistors with respect to the NMOS transistor 16 and the PMOS transistor 17. That is, a parasitic PMOS transistor having a gate insulation layer corresponding to the base insulation layer 2, a channel region corresponding to the region 11, and a source and a drain corresponding to the drain 6 and the source 7 is formed, while a parasitic NMOS transistor having a gate insulation layer corresponding to the base insulation layer 2, a channel region corresponding to the region 10, and a source and a drain corresponding to the source 4 and the drain 5 is formed. $V_{back}$ in FIG. 1(b) represents a voltage input to these parasitic CMOS transistors.

FIG. 9 shows input-output characteristics of a conventional CMOS inverter. In the case of conventional CMOS inverters, it is difficult to increase the absolute value of threshold voltages of parasitic MOS transistors. If the threshold values of the parasitic NMOS and PMOS transistors are $V_{thbn}$ and $V_{thbp}$, respectively, $V_{thbn} - V_{thbp}$ (the threshold value of the PMOS transistor being ordinarily negative) $> V_{DD} - V_{SS}$, that is, $V_{SS} < V_{SS} + V_{thbn} < V_{DD} + V_{thbp} < V_{DD}$. With respect to any value of $V_{back}$, the parasitic NMOS or PMOS transistor can operate. As shown in FIG. 9, in the case where $V_{in}$ becomes closer to $V_{DD}$ when $V_{back}$ is about zero, the parasitic PMOS transistor is operating and a leak current through the PMOS transistor inhibits the output from completely dropping to $V_{SS}$. On the other hand, in the case where $V_{in}$ becomes closer to $V_{SS}$ when $V_{back}$ is about 3 V, the parasitic NMOS transistor is operating and a leak current through the NMOS transistor inhibits the output from completely rising to $V_{DD}$.

As described above, a leak current flows by the operation of a parasitic CMOS transistor in the conventional CMOS inverter, resulting in failure to obtain an ideal input-output characteristic of the transistor.

For manufacture of a semiconductor device, monocrystal Si having a high carrier mobility is desirable in terms of high-speed driving performance. Conventionally, a SIMOX (separation by implanted oxygen) method has been used to form a monocrystal Si layer on an insulation layer. The thickness of the base insulation layer attained by this method is at most 500 nm. To increase the absolute value of the threshold value, it is necessary to increase the thickness of the base insulation layer according to a relationship between the base insulation layer thickness and the threshold value described later. However, it has been impossible to increase the base insulation layer thickness to a value greater than 500 nm for this manufacturing problem.

SUMMARY OF THE INVENTION

An object of the present invention is to provide a semiconductor device free from the above-described problem and a liquid crystal display using the semiconductor device.

Another object of the present invention is to provide a semiconductor device having an insulation layer thick enough to solve the above-described problem and a monocrystal silicon thin film formed on the insulation layer, and a liquid crystal display using the semiconductor device.

To achieve these objects, according to the present invention, there is provided a semiconductor device or a liquid crystal display using the semiconductor device in a peripheral drive circuit, the semiconductor device comprising an NMOS transistor and a PMOS transistor formed on at least one monocrystal Si region formed in a thin-film Si layer formed on an insulation layer, wherein the thickness $T_{BOX}$ of the insulation layer at a point where the NMOS and PMOS transistors are formed, the voltage $V_{SS}$ of a first power supply and the voltage $V_{DD}$ of a second power supply for the NMOS and PMOS transistors satisfy a relationship expressed by the following inequality:

$$T_{BOX} > (V_{DD} - V_{SS} - K_2)/K_1$$

where $V_{DD} > V_{SS}$, $K_1 \equiv \epsilon_{BOX}^{-1}(Q_{BN}+Q_{BP})$, $K_2 \equiv \phi_{FN}+\phi_{FP}$, $\epsilon_{BOX}$ is a dielectric constant of the base insulation layer, $Q_{BN}$ and $Q_{BP}$ are respective bulk charges of said NMOS and PMOS transistors when the widths of depletion layers of the NMOS and PMOS transistors are maximized, and $\phi_{FN}$ and $\phi_{FP}$ are pseudo Fermi potentials of the NMOS and PMOS transistors, respectively.

DESCRIPTION OF THE PREFERRED EMBODIMENTS

The present invention will be described below in detail.

As described above, in accordance with the principle of the operation of a CMOS inverter, a condition necessary for the existence of a value of $V_{back}$ with which parasitic NMOS and PMOS transistors cannot operate is $V_{SS}+V_{thbn} < V_{DD}+V_{thbp}$. The values of $V_{thbn}$ and $V_{thbp}$ are defined in such a way that $V_{thbn} > 0$ and $V_{thbp} < 0$ for enhancement-type transistors.

$V_{thbn}$ and $V_{thbp}$ can be expressed as shown below.

$$V_{thbn} = +(Q_{BN}/C_{BOX})+2\phi_{FN}+V_{FBN}$$

$$Q_{BN} = \sqrt{2q\epsilon_{Si}N_N(2\phi_{FN})} \qquad (1.1)$$

$$V_{FBN} = -qQ_{SS}/C_{BOX}+[\Phi_M-(\chi_{Si}+Eg/2+\phi_{FN})]$$

$$V_{thbp} = -(Q_{BP}/C_{BOX})-2\phi_{FP}+V_{FBP}$$

$$Q_{BP} = \sqrt{2q\epsilon_{Si}N_P(2\phi_{FP})} \qquad (1.2)$$

$$V_{FBP} = -qQ_{SS}/C_{BOX}+[\Phi_M-(\chi_{Si}+Eg/2-\phi_{FP})]$$

$C_{BOX}$: the capacity per unit area of the base insulation layer (F/m²)

q: elementary electric charge (C)

$N_C$: a channel impurity concentration (m⁻³) (The subscript C represents N or P.)

$\phi_{FN}$, $\phi_{FP}$: pseudo-Fermi potentials, in absolute value, of the NMOS and PMOS transistors $Q_{SS}$: fixed oxide charge density (m⁻²)

$\epsilon_{Si}$: permittivity of silicon (F/m)

$\phi_{FC}$: $=(kT/q)\ln(N_C/n_i)$ (The subscript C represents N or P)

k: Boltzmann's constant (J/K)

T: absolute temperature (K)

$n_i$: an intrinsic carrier density of Si (m⁻³)

$V_{FB}$: a flat band voltage (V)

$\Phi_M$: a work function of the substrate Si (eV)

$\chi_{Si}$: an electron affinity of Si (eV)

Eg: a band gap of Si (eV)

Figure 10A:
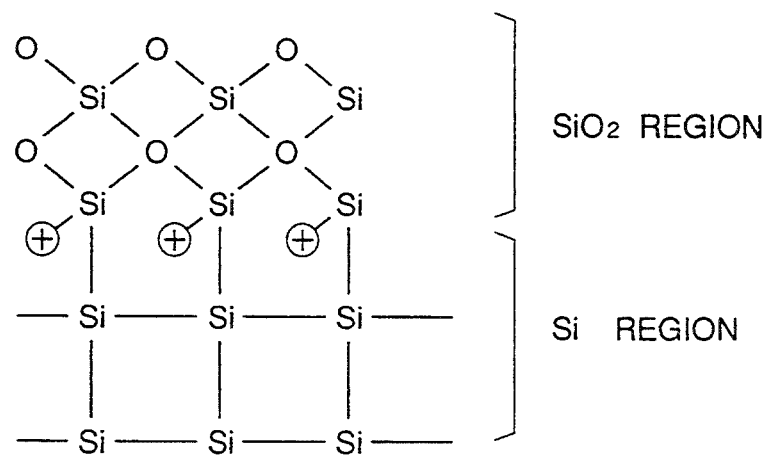
FIG. 10(a) is an illustration of the interface between $SiO_2$ and Si.

FIG. 10(a) shows the interface between the insulator region, $SiO_2$, and the channel region, Si. Major physical origin of $Q_{SS}$ is the dangling bonds at the interface between $SiO_2$ region and Si region, as shown in FIG. 10(a). + represents the dangling bonds.

Figure 10B:
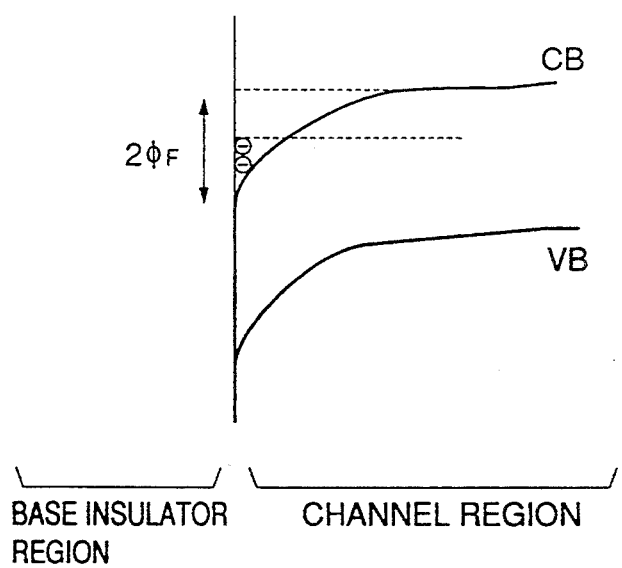
FIG. 10(b) is a band diagram of the interface between $SiO_2$ and Si.

FIG. 10(b) shows the band diagram of the back channel region when the parasitic back channel is formed.

The threshold voltage of the parasitic NMOS and PMOS transistors, $V_{thbn}$ or $V_{thbp}$, is explained by FIG. 10(b). If the voltage is applied in base substrate region, the conduction band and the valence band are bent. If the voltage is applied over $V_{thbn}$, the conduction band and the valence band are bent over $\phi_{FN}$, in which the electron can go through the channel region. That's why $V_{thbn} = Q_{BN}/C_{BOX}+2\phi_{FN}+V_{FBN}$.

$Q_{BN}/C_{BOX}$ is the compensation term caused from the space charge in the channel region.

Figure 11:
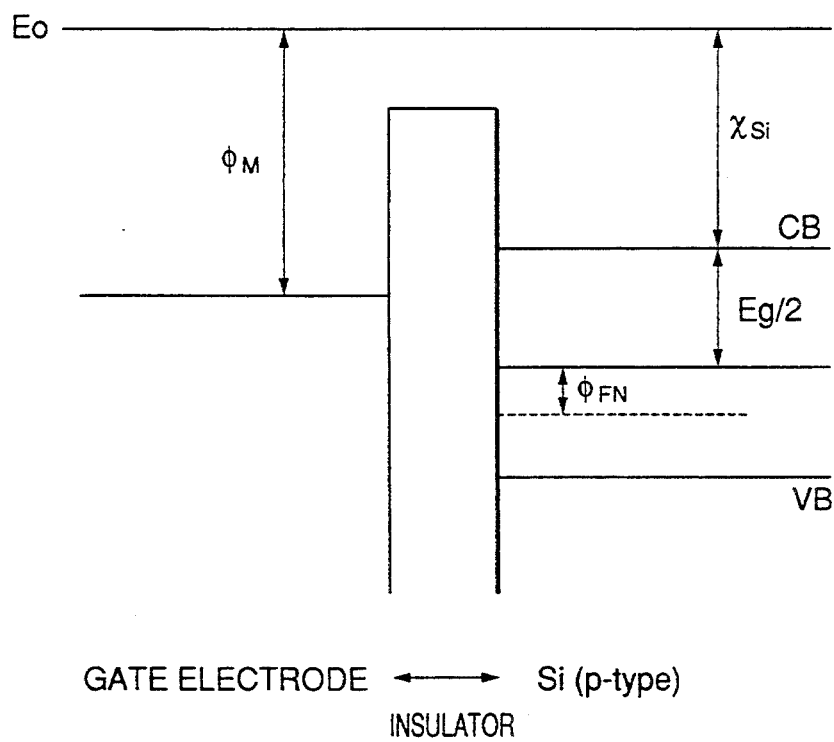
FIG. 11 is a band diagram of the gate electrode and Si.

FIG. 11 shows the band diagram of the gate electrode (base substrate, in this case) and the channel Si region. $V_{FBN}$ is the flat band voltage. $V_{FB}$ is composed of the term related to fixed oxide charge, $Q_{SS}$, and the term of the difference of the work function between the gate electrode and the channel Si region. Since the work function of the channel Si region is $\chi_{Si}+Eg/2+\phi_{FN}$, the difference of the work function is $\phi_M-(\chi_{Si}+Eg/2+\phi_{FN})$, where $\phi_M$ is the work function of the gate electrode.

Accordingly, $V_{thbn}$ and $V_{thbp}$ are shown as follows.

$$\begin{aligned}V_{thbn} &= \frac{Q_{BN}}{C_{BOX}} + 2\phi_{FN} + V_{FBN} \\ &= \frac{Q_{BN}}{C_{BOX}} + 2\phi_{FN} - \frac{qQ_{SS}}{C_{BOX}} + \\ &\quad \phi_M - \left(\chi_{Si} + \frac{Eg}{2} + \phi_{FN}\right)\end{aligned}$$

-continued $$V_{thbp} = -\frac{Q_{BP}}{C_{BOX}} - 2\phi_{FP} + V_{FBP}$$

$$= -\frac{Q_{BP}}{C_{BOX}} - 2\phi_{FP} - \frac{qQ_{SS}}{C_{BOX}} +$$

$$\phi_M - \left( \chi_{Si} + \frac{E_g}{2} - \phi_{FP} \right)$$

Therefore, $$V_{thbn} - V_{thbp} = (Q_{BN} + Q_{BP})/C_{BOX} + \phi_{FN} + \phi_{FP}.$$

Each of the $Q_{BN}$, $Q_{BP}$, $\phi_{FN}$, and $\phi_{FP}$ in the above has only one value if the impurity concentrations $N_N$ and $N_P$ are determined.

Since $C_{BOX} = \epsilon_{BOX}/T_{BOX}$ $\epsilon_{BOX}$: a dielectric constant of the base insulation layer (F/m)

$T_{BOX}$: the thickness of the base insulation layer (m), only $C_{BOX}$ in the above equation is changed with the thickness of the base insulation layer. It should be noted that $\phi_M$ is dependent on the doping of the base substrate Si. However, the dependence does not affect the result of $V_{thbn} - V_{thbp}$. Accordingly, $$V_{thbn} - V_{thbp} = K_1 T_{BOX} + K_2$$

where $$K_1 \equiv \epsilon_{BOX}^{-1}(Q_{BN} + Q_{BP})$$

and $$K_2 \equiv \phi_{FN} + \phi_{FP}.$$

$$\therefore V_{DD} - V_{SS} < V_{thbn} - V_{thbp} = K_1 T_{BQX} + K_2$$

$$\therefore T_{BOX} > (V_{DD} - V_{SS} - K_2)/K_1$$

If the base insulation layer has a thickness such as to satisfy this inequality, the absolute value of the threshold values can be increased so that occurrence of a leak current is prevented.

According to the present invention, the method of manufacturing the base insulation layer is not particularly limited so long as the thickness in accordance with the above-described inequality is attained. However, the thickness of an insulation layer in the conventional SIMOX substrate cannot be indefinitely increased, as described above. In accordance with the present invention, a monocrystal Si region can be formed on a thick insulation layer, for example, by epitaxial growth on an SIMOX or porous Si substrative member changed in condition, or by laser-annealing a polycrystalline or amorphous Si thin film.

The present invention will be described with respect to examples thereof.

Embodiment 1

A monocrystal Si thin film was formed by using a porous Si substrate member. A method of manufacturing this monocrystal Si thin film will be described below.

In the porous Si substrate member used, holes having a diameter of about 60 nm on an average are formed, which were observed through a transmission microscope. The density of the porous Si substrate is at most half that of monocrystal Si, but its monocrystal properties are maintained and a monocrystal Si layer can be formed on the porous layer by epitaxial growth. However, a rearrangement of internal holes takes place at 1,000° C. or higher, and the characteristics of enhanced etching are thereby impaired. For this reason, a low-temperature growing method, such as a molecular beam epitaxial growth method, a plasma chemical vapor deposition (CVD) method, a thermal CVD method, a photo-CVD method, a bias sputtering method, or a liquid crystal growth method, is preferred as a method for growing the Si layer.

A method in which P-type Si is made porous and a monocrystal layer is thereafter grown by epitaxial growth will be described below.

First, a Si monocrystal substrate member is prepared and is processed by an anodization method using a HF solution to form a porous layer therein. While the density of monocrystal Si is $2.33 \times 10^3$ kg/m$^3$, the density of the porous Si can be changed in the range of 0.6 to $1.1 \times 10^3$ kg/m$^3$ by changing the HF solution concentration in the range of 20 to 50% by weight. This porous layer can easily be formed into a P-type Si substrate member for a reason described below.

Porous Si was found in a process of studying electrolytic polishing of a semiconductor. In a dissolution reaction of Si in anodization, positive holes are required for anodization of Si in the HF solution. This reaction is expressed as follows.

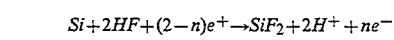

$$SiF_2 + 2HF \rightarrow SiF_4 + H_2$$

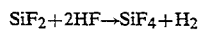

or

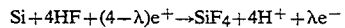

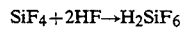

Symbols $e^+$ and $e^-$ represent holes and electrons, respectively. Each of n and λ represents the number of holes, in the relevant equation, necessary for dissolving one Si atom. Porous Si is formed on condition that $n > 2$ or $\lambda > 4$.

From this fact, it can be said that P-type Si in which holes exist can easily be made porous.

On the other hand, it has been reported that high-density N-type Si can be made porous. Thus, a Si substrate member can be made porous irrespective of being P- or N-type.

Also, the density of the porous layer is a half or less of the original density, since many gaps are formed in the porous layer. Therefore the surface area is greatly increased relative to the volume. The chemical etching speed is thereby increased remarkably in comparison with the etching speed of the ordinary monocrystal layer.

Conditions for making monocrystal Si porous by anodization are shown below. A starting material of porous Si formed by anodization is not limited to monocrystal Si, and Si in other crystalline structures can be used.

Applied voltage: 2 (V)
Current density: $3.0 \times 10^2$ Am$^{-2}$
anodization solution: HF:H$_2$O:C$_2$H$_5$OH = 1:1:1
Time: 2.4 (hours)

Thickness of porous Si: 300 (μm)
Porosity: 56%

Si is grown by epitaxial growth on porous Si formed in this manner, thereby forming a monocrystal Si thin film. The thickness of the monocrystal Si thin film is, preferably, 50 μm or less, more preferably, 20 μm or less.

A surface of the monocrystal Si thin film is then oxidized. A substrate member which is to finally form a main substrate is prepared and is attached to the oxide film in the monocrystal Si surface. Alternatively, a surface of monocrystal Si substrate member newly prepared is oxidized and is attached to the monocrystal Si layer on the porous Si substrate member. The reason for the provision of such an oxide film between the :substrate member and the monocrystal Si layer is because an interface level generated from a base interface of a Si active layer with an oxide film can be smaller than, for example, an interface level from a base interface with a glass provided as a substrate member. It is possible to greatly improve characteristics of an electronic device by forming such an oxide film interface. Further, only a monocrystal Si thin film prepared by removing a porous Si substrate member by a selective etching process described later may be attached to a new substrate member. Two substrate members can be attached closely enough to prevent separation between them by the van der Waals force, if their surfaces are washed and thereafter brought into contact with each other at room temperature. However, the substrate members in this state are processed by a heat treatment in a nitrogen atmosphere at a temperature in the range of 200° to 900° C., preferably, 600° to 900° C.

An $Si_3N_4$ layer is formed as an etching prevention film by deposition over the entire surface of the two attached substrate members. Only the portion of the $Si_3N_4$ layer on the surface of the porous Si substrate member is then removed. Apiezon wax may be used instead of $Si_3N_4$. Thereafter, the porous Si substrate member is entirely removed by etching or other means. A semiconductor substrate having a thin monocrystal Si layer can be obtained in this manner.

A selective etching method for etching only the porous Si substrate member by non-electrolyte wet etching will be described below.

As an etching liquid having no etching effect with respect to crystalline Si but capable of selectively etching only porous Si, it is preferable to use hydrofluoric acid, buffered hydrofluoric acid of ammonium fluoride ($NH_4F$), hydrogen fluoride (HF) or the like, a liquid of a mixture of hydrofluoric acid or buffered hydrofluoric acid and hydrogen peroxide solution, a liquid of a mixture of hydrofluoric acid or buffered hydrofluoric acid and alcohol, or a liquid of a mixture of hydrofluoric acid or buffered hydrofluoric acid, hydrogen peroxide solution and alcohol. The substrate members attached to each other undergo etching by being wetted with such an etching liquid. The etching speed depends upon the concentration of hydrofluoric acid, buffered hydrofluoric acid and hydrogen peroxide in the solution and upon the temperature. By the addition of the hydrogen peroxide solution, the oxidation of Si is promoted and the reaction speed is increased in comparison with an etching liquid to which no hydrogen peroxide solution is added. Further, the reaction speed can be controlled by changing the proportion of the hydrogen peroxide solution. By the addition of alcohol, bubbles of a reaction product gas can be instantly removed from the etched surface without agitation, and the porous Si can be etched uniformly and efficiently.

The HF concentration in buffered hydrofluoric acid is set in the range of, preferably, 1 to 95%, more preferably, 1 to 85% and further preferably, 1 to 70% by weight of the etching liquid.

The $NH_4F$ concentration in buffered hydrofluoric acid is set in the range of, preferably, 1 to 95% more preferably, 5 to 90%, and further preferably, 5 to 80% by weight of the etching liquid.

The HF concentration is set in the range of, preferably, 1 to 95%, more preferably, 5 to 90%, and further preferably, 5 to 80% by weight of the etching liquid.

The $H_2O_2$ concentration is set in the range of, preferably, 1 to 95%, more preferably, 5 to 90%, and further preferably, 10 to 80% by weight of the etching liquid, and is set in a range such that the above-described effect of hydrogen peroxide solution can be attained.

The alcohol concentration is set in the range of, preferably, 80% or less, more preferably, 60% or less, and further preferably, 40% or less by weight of the etching liquid, and is set in a range such that the above-described effect of alcohol can be attained.

The temperature is set in the range of, preferably, 0° to 100° C., more preferably, 5° to 80° C., and further preferably, 5° to 60° C.

Alcohol used in accordance with the present invention comprises ethyl alcohol, isopropyl alcohol and the like, i.e., alcohols which entail no considerable problem in the manufacturing process in practice and which ensure the above-described alcohol addition effect.

In the semiconductor substrate obtained in this manner, a thin large-area layer of monocrystal Si equivalent to the ordinary Si wafer is formed flat and uniformly to cover the entire area on the substrate.

A monocrystal Si thin film, such as the one described in detail in the specification of European Patent Laid-Open Publication No. 469630, can be specifically used as the above-described monocrystal Si thin film in accordance with the present invention.

In this embodiment of the invention, a $SiO_2$ film having a thickness of 1,000 nm was formed on a monocrystal Si substrate, and was attached to a monocrystal Si thin film to form a base insulation layer. A CMOS inverter such as that shown in FIG. 1 was manufactured by using this base insulation layer. The method of setting the above-mentioned film thickness will be described below.

Figure 3:
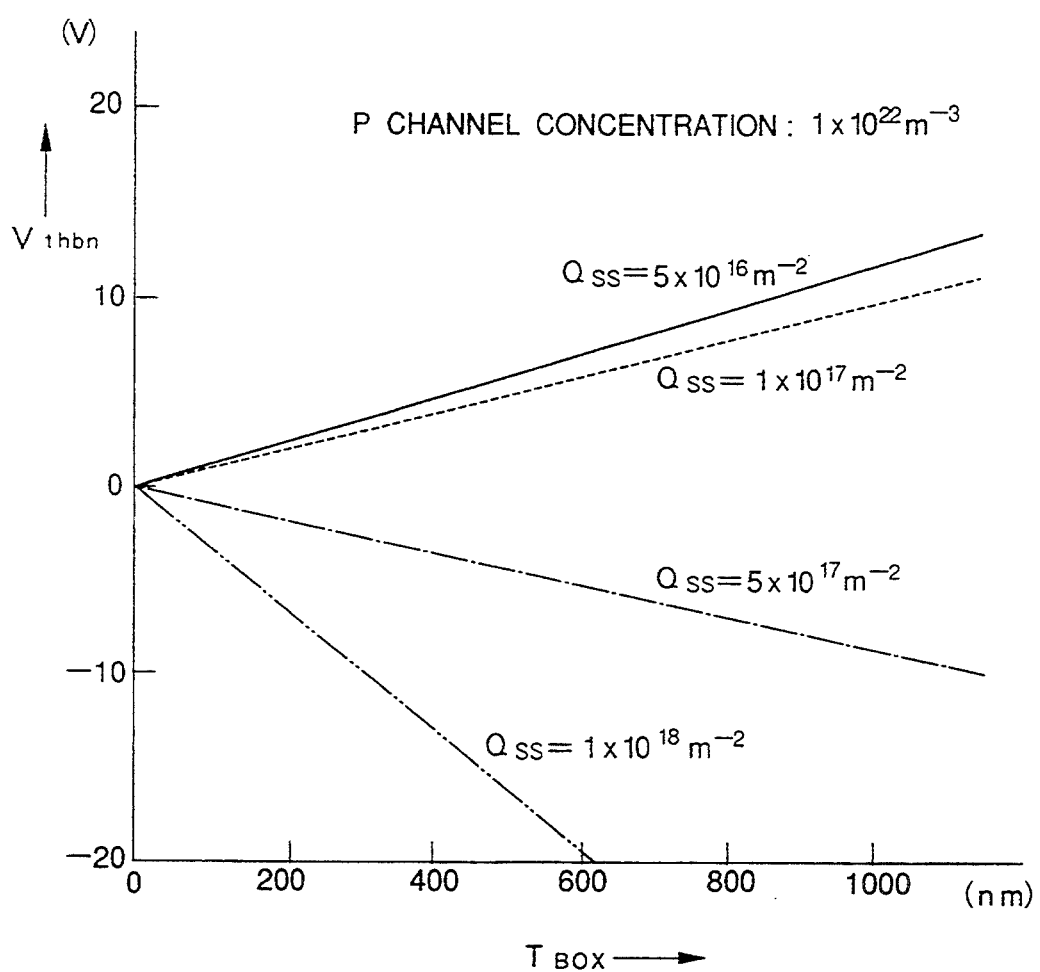
FIG. 3 is a diagram of film thickness-threshold value characteristics of a parasitic NMOS transistor.

FIG. 3 shows film thickness ($T_{Box}$)-threshold value ($V_{thbn}$) characteristics of a parasitic NMOS transistor with $Q_{SS}$ (fixed positive charge on the base insulation layer) ($m^{-2}$) used as a parameter. The density in the channel region was set to $1 \times 10^{22}$ $m^{-3}$.

The calculation based on the equation in page 8-11 is shown as follows, where $q = 1.60 \times 10^{-19}$ (C)

$\epsilon_{Si} = 11.7 \times 8.85 \times 10^{-12}$ [F/m]

$= 1.04 \times 10^{-10}$ [F/m]

$n_i = 1.5 \times 10^{16}$ [$m^{-3}$] at 300 K.
$\epsilon_{BOX} = 3.9 \times 8.85 \times 10^{-12} = 3.45 \times 10^{-11}$ [F/m]
$k = 1.38 \times 10^{-23}$ [J/K.]
$Q_{BN}$ is calculated using (1.1).

$$Q_{BN} = \sqrt{2q \, \epsilon_{Si} \, N_N (2\phi_{FN})}$$

-continued $$\phi_{FN} = \frac{kT}{q} \ln\left(\frac{N_N}{ni}\right) =$$

$$\frac{1.38 \times 10^{-23} \times 300}{1.6 \times 10^{-19}} \ln\left(\frac{10^{22}}{1.5 \times 10^{16}}\right)$$

$$= 0.0259 \times 13.41$$

$$= 0.348 \text{ (V)}$$

$$\therefore Q_{BN} =$$

$$\sqrt{2 \times 1.6 \times 10^{-19} \times 1.035 \times 10^{-10} \times 10^{22} \times 2 \times 0.348}$$

$$= 4.79 \times 10^{-4} \text{ (C/m}^2\text{)}$$

Figure 4:
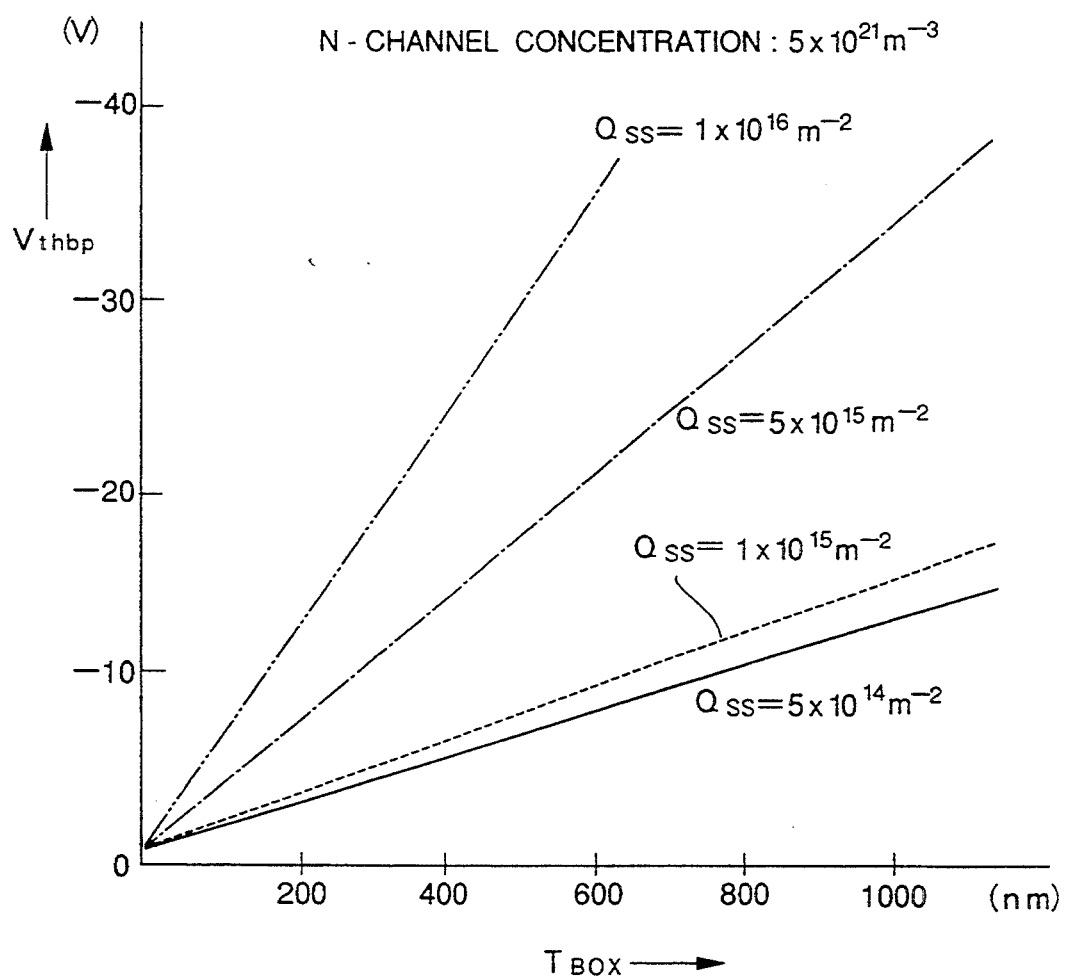
FIG. 4 is a diagram of film thickness-threshold value characteristics of a parasitic PMOS transistor.

FIG. 4 shows film thickness-threshold value ($V_{thbp}$) characteristics of a parasitic PMOS transistor with $Q_{SS}$ used as a parameter. The density in the channel region was set to $5 \times 10^{21}$ m$^{-3}$.

$Q_{BP}$ is calculated using (1.2) similar to calculation of $Q_{BN}$.

$$Q_{BP} = \sqrt{2q\epsilon_{Si}N_P(2\phi_{FP})}$$

$$= \sqrt{2 \times 1.6 \times 10^{-19} \times 1.035 \times 10^{-10} \times 5 \times 10^{21} \times 2 \times 0.0259 \times \ln\left(\frac{5 \times 10^{21}}{1.5 \times 10^{16}}\right)}$$

$$= 3.30 \times 10^{-4} \text{ [F/m}^2\text{]}$$

$$C_{BOX} = \frac{3.45 \times 10^{-11}}{T_{BOX}} \text{ [F/m]}$$

$$\phi_M - \left(\chi_{Si} + \frac{Eg}{2} + \phi_{FN}\right) = (4.15 + 0.56) - (4.15 + 0.56 - 0.329)$$

$$= +0.329 \text{ (V)}$$

The calculation of minimum $T_{BOX}$ is calculated as follows.

$$K_2 = \epsilon_{BOX}^{-1}(Q_{BP} + Q_{BN}) =$$

$$(3.45 \times 10^{-11})^{-1} \times (3.30 + 4.79) \times 10^{-4}$$

$$= 2.34 \times 10^7 \text{ [V/m]}$$

$$\therefore \frac{V_{DD} - V_{SS} - \phi_{FP} - \phi_{FB}}{K_2} = \frac{14 - 0.329 - 0.348}{2.34 \times 10^7}$$

$$= 5.69 \times 10^{-7} \text{ [m]}$$

$$= 569 \text{ [nm]}$$

Therefore, the thickness of film is designed greater than 569 [nm] when $V_{DD}-V_{SS}=14$ (V).

Figure 5:
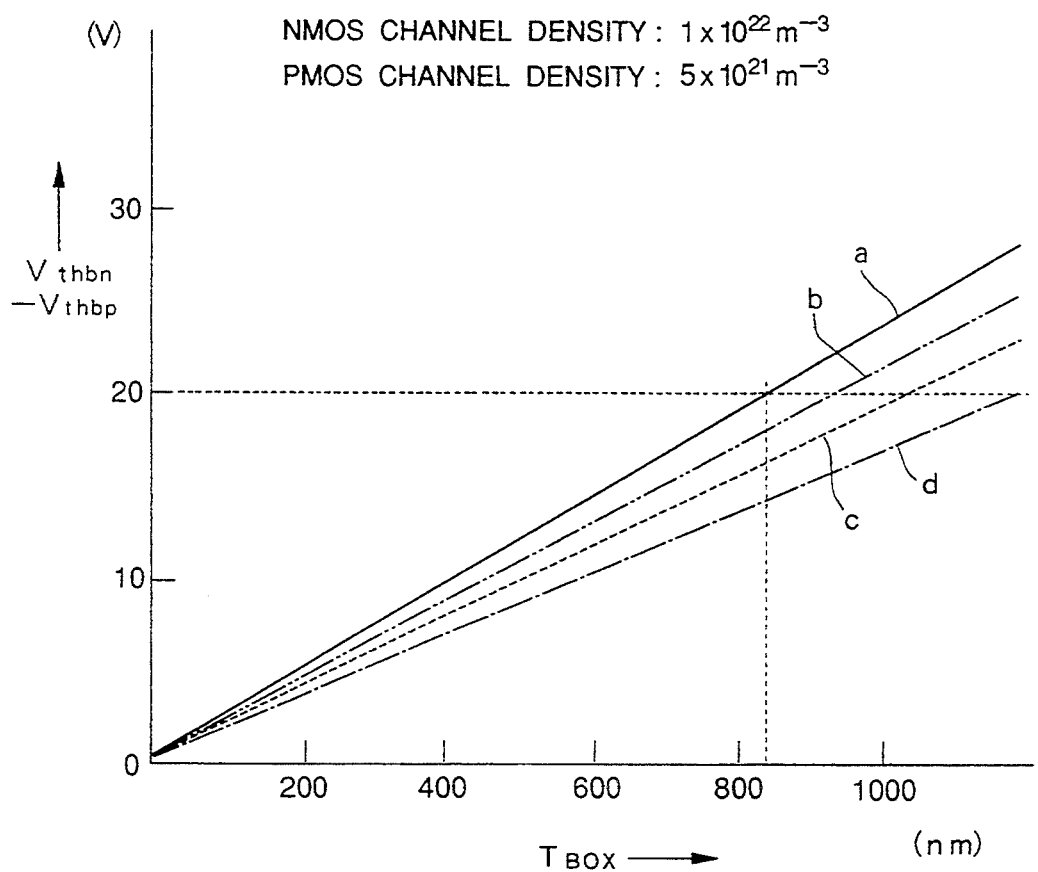
FIG. 5 is a diagram of a relationship between the threshold value and the film thickness of the parasitic MOS transistors.

FIG. 5 shows a relationship between the film thickness and the threshold value difference $V_{thbn}-V_{thbp}$ between the two transistors on the basis of the data shown in FIGS. 3 and 4 with respect to the channel densities of $1 \times 10^{22}$ m$^{-3}$ and $5 \times 10^{22}$ m$^{-3}$.

Figure 1A:
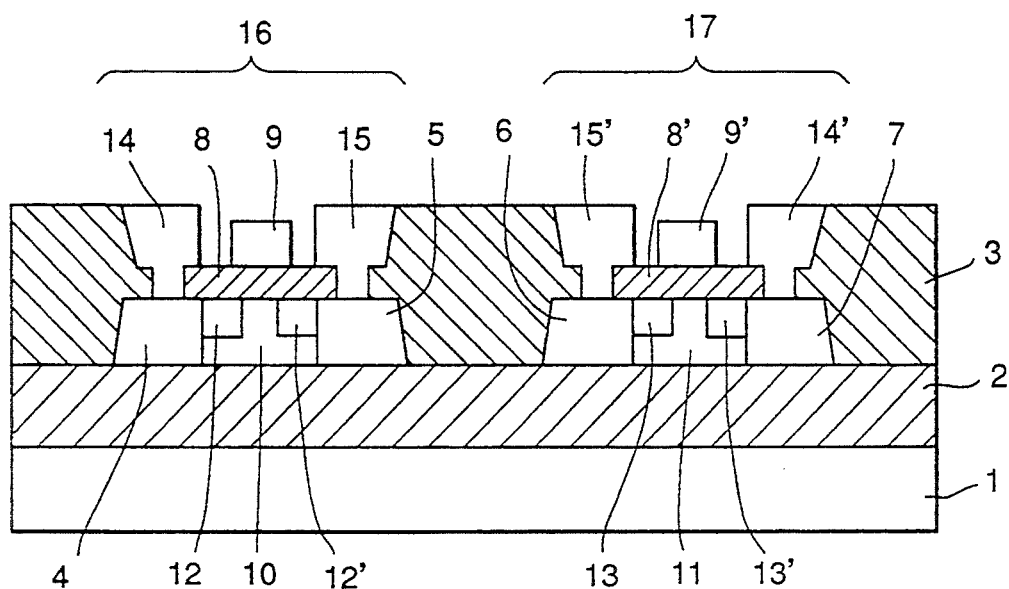
FIG. 1(a) is a cross-sectional view of an example of a semiconductor device in accordance with the present invention.
Figure 1B:
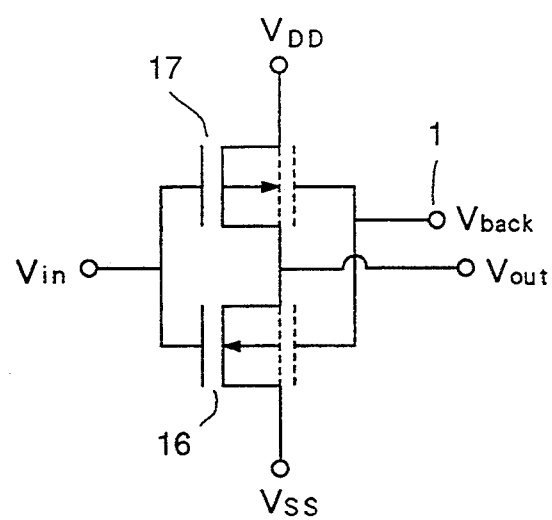
FIG. 1(b) is a equivalent circuit diagram of the semiconductor device shown in FIG. 1.

As described above, for the existence of a value of $V_{back}$ with which the parasitic NMOS and PMOS transistors cannot operate, at least $V_{DD}-V_{SS} < V_{thbn}-V_{thbp}$ must be satisfied. The graph of FIG. 5 is formed by using, as a parameter, allowable values of currents flowing in gate voltage ranges below the threshold values. In FIG. 1, the relationship between $V_{thbn}-V_{thbp}$ and $T_{BOX}$ is shown with respect to a current of 1 µA flowing when $V_{back}=V_{thbn}$, $V_{thbp}$, a current down by a factor of $10^2$ therefrom (allowable current=10 nA), a current down by a factor of $10^4$ (allowable current=100 pA), and a current down by a factor of $10^6$ (allowable current=1 pA). There is no influence of $Q_{SS}$ upon the relationship shown in this graph.

It is found that for TV image display application, the leak current up to 100 pA per 1 µm gate width is allowable in ensuring the circuit operation.

In this embodiment, a base insulation layer thickness $T_{BOX}=1,000$ nm was determined from FIG. 5 under conditions: $V_{DD}-V_{SS}=14$ V, an allowable current of 100 pA, and a margin of 5 V between the threshold value difference and $V_{DD}-V_{SS}$.

Figure 2:
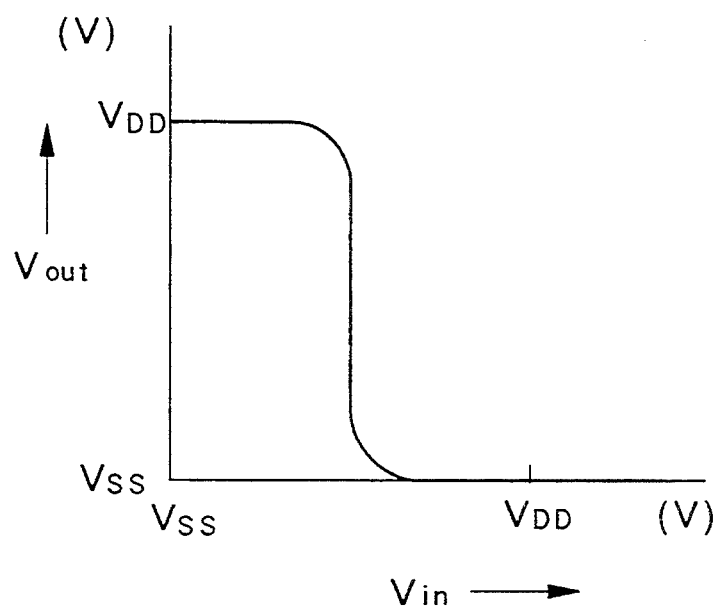
FIG. 2 is a diagram of an input-output characteristic of a CMOS inverter in accordance with a first embodiment of the present invention.

FIG. 2 shows an input-output characteristic of this CMOS inverter. Input-output values closer to an ideal characteristic were exhibited with respect to $V_{DD}=8$ V, $V_{SS}=-6$ V, and $V_{back}=3$ V. This CMOS inverter can be used in a driving circuit having a high power supply voltage, 14 V.

Embodiment 2

A semiconductor device was manufactured in the same manner as Embodiment 1 except that a base insulation layer was formed so as to have a three-layer structure formed of 800 nm thick layer of SiO$_2$, a 50 nm thick layer of SiN, and a 100 nm thick layer of SiO$_2$. The thickness of this three-layer film corresponds to about 925 nm in terms of the thickness of the SiO$_2$ single layer structure as determined by conversion with respect to the dielectric constant. In this embodiment, the thickness of $T_{BOX}$ satisfies with the following calculation.

$$K_2 = \epsilon_{BOX}^{-1}(Q_{BN} + Q_{BP}) = 2.34 \times 10^7 \text{ [V/m]}$$

$$T_{BOX} > (V_{DD} - V_{SS} - \phi_{FN} - \phi_{FP})/K_2$$

$$= \frac{14 - 0.348 - 0.329}{2.34 \times 10^7}$$

$$= 5.69 \times 10^{-7}$$

$$= 569 \text{ (nm)}$$

SiN was deposited by a low pressure CVD method. Alternatively, SiN may be formed by being nitrized by rapid thermal annealing at 1,000° C. after SiO$_2$ deposition.

In a case where there is a need to partially remove the Si substrate by etching on the back side thereof, for example, for the purpose of forming a transparent portion such as that of a display portion of a liquid crystal display, etching can easily be stopped since the SiN layer acts as a suitable stopper, and cutting-out can be performed by uniform back-side etching.

The operation at $V_{DD}-V_{SS}=14$ V was substantially possible, although the threshold values of the parasitic MOS transistors were slightly reduced in comparison with Embodiment 1.

Embodiment 3

Conventionally, a SIMOX substrate is manufactured by a method of injecting, ordinarily, 3 to 5 separated shots of an amount of oxygen ions of $4\times10^{21}$ to $2.4\times10^{22}$ m$^{-2}$ with acceleration energy of 150 to 300 keV, and thereafter performing a heat treatment at 1,100° to 1,250° C. for 2 to 20 hours.

In this embodiment, oxygen ions were injected by double-charging using a charge twice as large as the ordinary charge, while an average ion injection range (ion injection depth) $R_p=800$ nm and a dispersion of ion injection range $\Delta R_p=400$ nm were set. SiO$_2$ film having a thickness of 1,000 nm was thereby formed. A CMOS inverter similar to that in accordance with Embodiment 1 was manufactured by using this SIMOX substrate. The CMOS inverter obtained had no leak and had an improved characteristic.

Embodiment 4

Figure 6A:
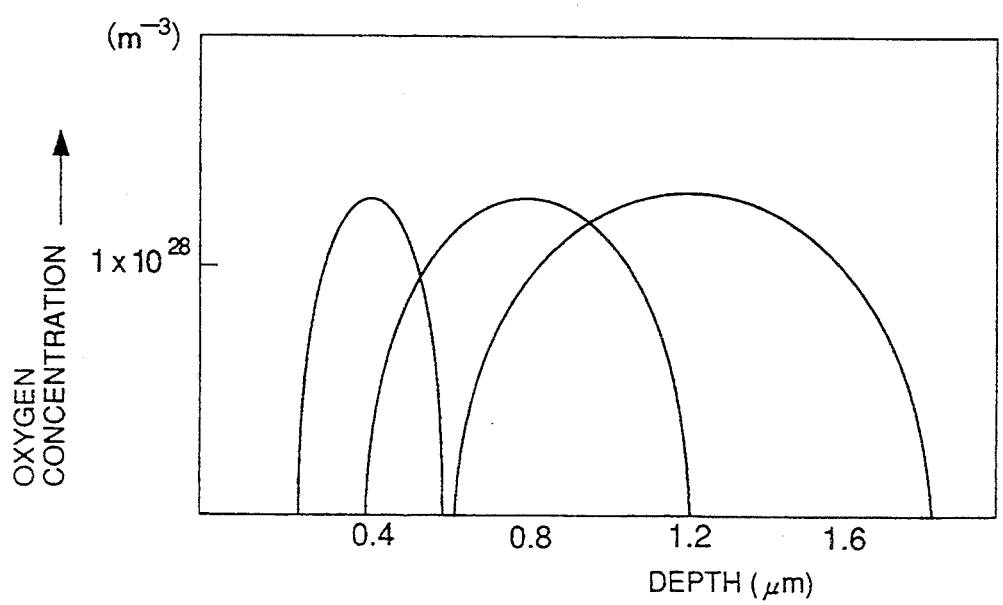
FIG. 6(a) is a diagram of a SIMOX process practiced in accordance with a fourth embodiment of the present invention.
Figure 6B:
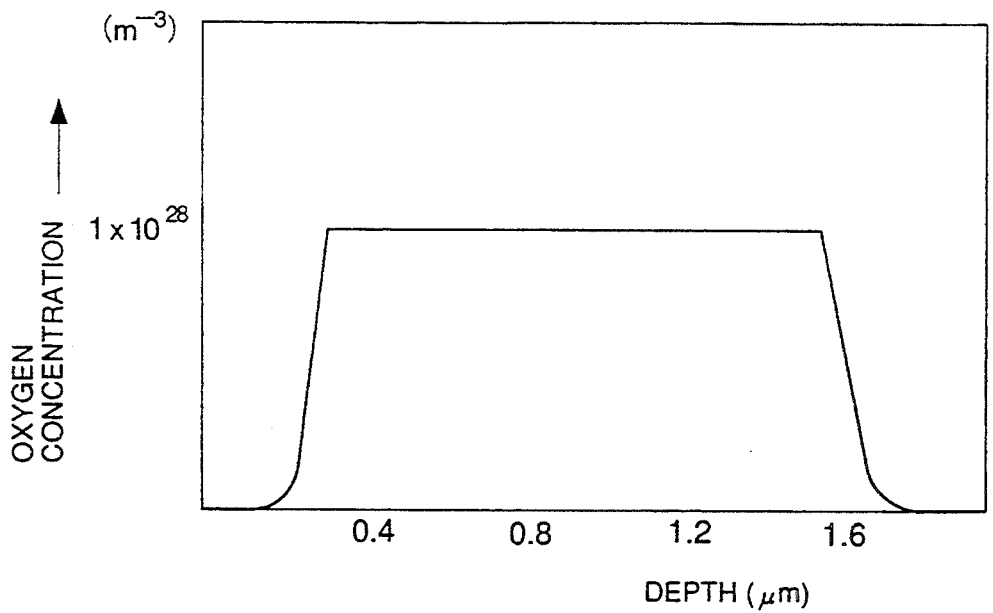
FIG. 6(b) is a oxygen concentration profile of the process of the fourth embodiment.

A SIMOX substrate was manufactured by changing energy for oxygen ion injection by three steps as shown in FIG. 6(a). That is, oxygen ions were injected under conditions: $R_p=150, 250, 400$ keV, and ion injection dose$=5\times10^{21}$, $2\times10^{22}$, $4\times10^{22}$ m$^{-2}$, followed by a heat treatment at 1,200° C. for 36 hours. With an oxygen profile such as that shown in FIG. 6(b), SOI (silicon on insulator) on SiO$_2$ film having a thickness of about 1.3 µm was realized. A 20 V driving circuit can be made by forming a CMOS inverter on this SIMOX substrate. The thickness of the SIMOX is calculated as follows.

$$(V_{DD} - V_{SS} - \phi_{FN} - \phi_{FP})/K_2 = \frac{20 - 0.348 - 0.329 \text{ (V)}}{2.34 \times 10^7 \text{ (V/m)}}$$
$$= 8.26 \times 10^{-7} \text{ (m)}$$
$$= 826 \text{ (nm)}$$

Therefore, the thickness of the SIMOX is designed greater than 826 (nm).

Embodiment 5

Figure 7A:
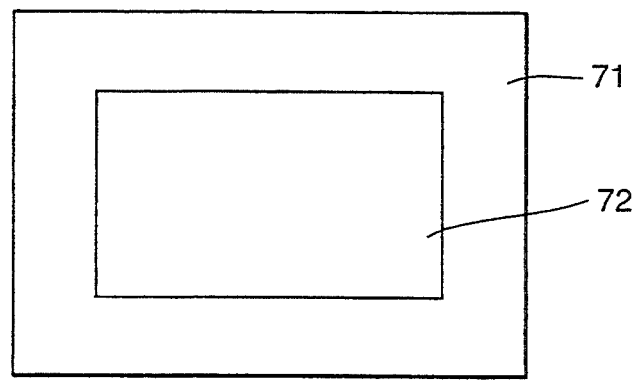
FIGS. 7(a) and 7(b) illustrates of a fifth embodiment of the present invention.
Figure 7B:
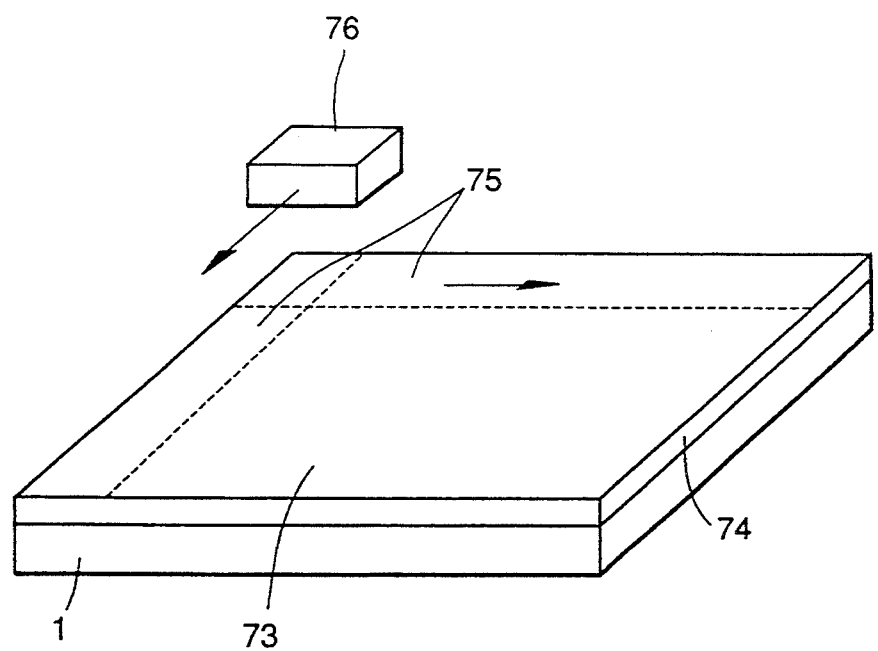

An active matrix type of liquid crystal display having a semiconductor device in accordance with the present invention was manufactured by forming a polycrystalline or amorphous Si layer on a transparent substrate and by processing a necessary portion thereof by laser annealing so that the processed portion is changed into a monocrystal. FIG. 7(a) is a plan view of this display. A display portion 72 is formed at the center of the substrate and is surrounded by a drive circuit portion 71. Chips integrated in an active matrix and a circuit for driving the matrix are provided on a device region 74 formed in an amorphous region 73. A laser light source used for laser annealing is of a high output (5 to 1,000 mW) type using a helium neon lamp as a light source. In the display in accordance with this embodiment, only the drive circuit is required to have a high-speed switching operation. Therefore, only the drive circuit portion is scanned with the laser light source, as illustrated. The scanned portion is changed into a monocrystal region where time carrier mobility is the same as that in ordinary monocrystal Si, thereby enabling high-speed driving. The manufacturing cost is increased by the laser annealing process. However, the increase in the manufacturing cost is limited by setting a necessary minimum processed region as described above. It is thereby possible to manufacture a high-integration high-resolution liquid crystal display having two hundred thousand or more pixels.

Embodiment 6

Figure 8:
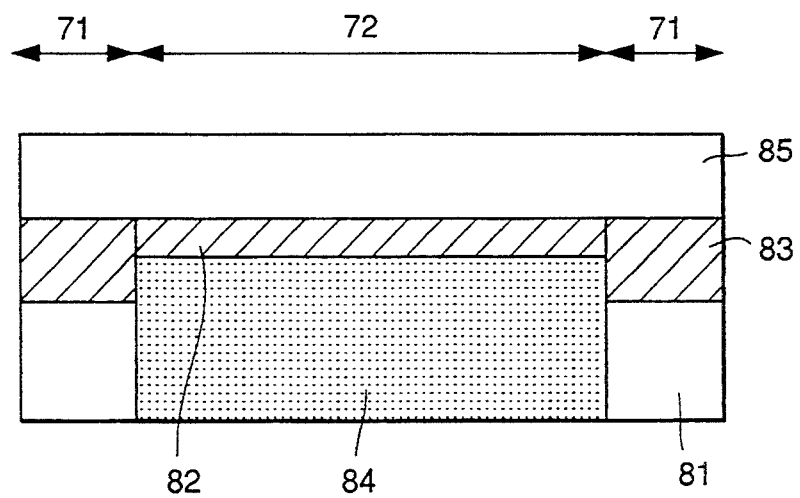
FIG. 8 is a cross-sectional view of a sixth embodiment of the present invention.
Figure 9:
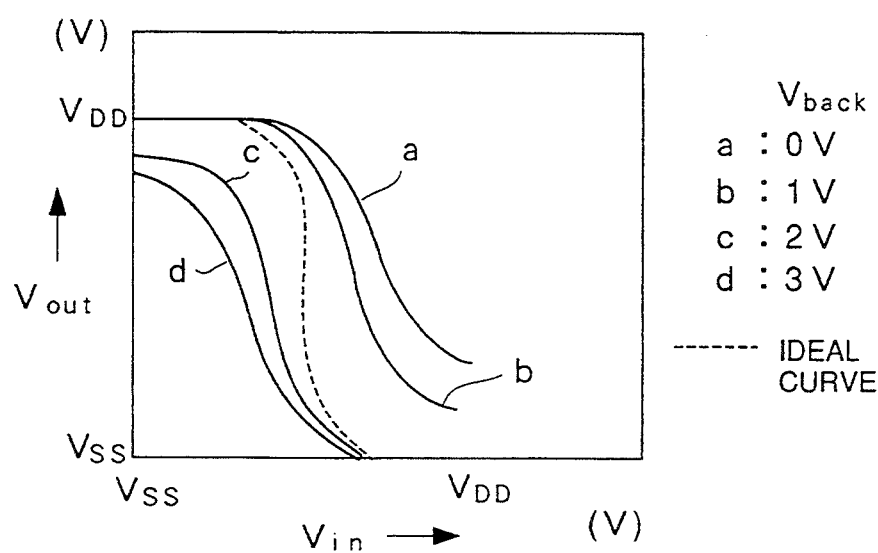
FIG. 9 is a diagram of input-output characteristics of a conventional CMOS inverter.

FIG. 8 shows an example of a preferred form of the liquid crystal display in accordance with the present invention. In this embodiment, a drive circuit portion 71 is formed on a thick SiO$_2$ film 83 (having a thickness of 1,000 (nm), for example), enabling driving of $V_{DD}-V_{SS}=14$ V. The thickness of SiO$_2$ film 83 is calculated as follows.

$$(V_{DD} - V_{SS} - \phi_{FN} - \phi_{FP})/K_2 = \frac{14 - 0.348 - 0.329}{2.34 \times 10^7}$$
$$= 569 \text{ (nm)}$$

Therefore, the thickness of the SiO$_2$ film 83 is designed greater than 569 (nm).

A display portion 72 in which transistors serving as switching devices for applying voltages to liquid crystal cells are arranged in the form of a matrix is formed on a thin SiO$_2$ film 82. A monocrystal Si substrate 81 at the back side of the display portion 72 is partially removed by wet etching, and a space thereby formed is filled with a back packing (silicone rubber) 84 for reinforcement. This packing is almost transparent and allows back light from under to pass in order to efficiently illuminate the display portion.

An NMOS transistor consisting of monocrystalline Si, a PMOS transistor consisting of monocrystalline Si, a TFT (Thin Film Transistor) consisting of poly-crystalline Si or a TFT consisting of amorphous Si can be used as switching device in the display portion. The back packing 84 is insulator and also plays a role in strengthening the display portion.

Thus, an unnecessary increase in the SiO$_2$ film is limited to reduce stresses remaining in the SiO$_2$ film and the device region after cutting-out of the monocrystal silicon substrate. It is thereby possible to avoid an arrangement of liquid crystal cells on the outer device region and to improve image qualities.

As described above, in the semiconductor device in accordance with the present invention, a leak current, relating to the problem of the conventional art, can be prevented by controlling the film thickness of the base insulation layer. The semiconductor device can there perform high speed driving with a high power supply voltage. The liquid crystal display of the present invention using the semiconductor device in a drive circuit can be designed for high-resolution high-image-quality image display.

While the present invention has been described with respect to what presently are considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A semiconductor device comprising an insulation layer, a thin-film Si layer formed on said insulation layer and having at least one monocrystal Si region formed therein, and an NMOS transistor and a PMOS transistor formed on said at least one monocrystal Si region, wherein a thickness $T_{BOX}$ of said insulation layer at a point where said NMOS and PMOS transistors are formed, a voltage $V_{SS}$ of a first power supply and a voltage $V_{DD}$ of a second power supply to be connected to said NMOS and PMOS transistors, respectively, satisfy a relationship expressed by the following inequality:

$$T_{BOX} > (V_{DD} - V_{SS} - K_2)/K_1$$

where $V_{DD} > V_{SS}$, $K_1 \equiv \epsilon_{BOX}^{-1}(Q_{BN} + Q_{BP})$, $K_2 \equiv \phi_{FN} + \phi_{FP}$, $\epsilon_{BOX}$ is a dielectric constant of said base insulation layer, $Q_{BN}$ and $Q_{BP}$ are respective bulk charges of said NMOS and PMOS transistors when widths of depletion layers of said NMOS and PMOS transistors are maximized, and $\phi_{FN}$ and $\phi_{FP}$ are pseudo-Fermi potentials of said NMOS and PMOS transistors, respectively.

2. A liquid crystal display in which a switching transistor is used as a pixel electrode switching device, comprising a peripheral device circuit including a semiconductor device, said semiconductor device including an insulation layer, a thin-film Si layer formed on said insulation layer with at least one monocrystal Si region formed therein, and a CMOS inverter including an NMOS transistor and a PMOS transistor formed on said at least one monocrystal Si region, wherein a thickness $T_{BOX}$ of said insulation layer at a point where said NMOS and PMOS transistors are formed, a voltage $V_{SS}$ of a first power supply and a voltage $V_{DD}$ of a second power supply to be connected to said NMOS and PMOS transistors, respectively, satisfy a relationship expressed by the following inequality:

$$T_{BOX} > (V_{DD} - V_{SS} - K_2)/K_1$$

where $V_{DD} > V_{SS}$, $K_1 \equiv \epsilon_{BOX}^{-1}(Q_{BN} + Q_{BP})$, $K_2 \equiv \phi_{FN} + \phi_{FP}$, $\epsilon_{BOX}$ is a dielectric constant of said base insulation layer, $Q_{BN}$ and $Q_{BP}$ are bulk charges when widths of depletion layers of said NMOS and PMOS transistors are maximized, and $\phi_{FN}$ and $\phi_{FP}$ are pseudo-Fermi potentials of said NMOS and PMOS transistors, and wherein said switching transistor is formed on a display portion of said insulation layer and said CMOS inverter is formed on a drive circuit portion of said insulation layer.

3. A liquid crystal display according to claim 2, wherein the said switching transistor is PMOS transistor.

4. A semiconductor device according to claim 1 or claim 2, wherein said monocrystal Si region comprises a thin film obtained by epitaxial growth on a porous Si substrate member.

5. A semiconductor device according to claim 1 or claim 2, wherein said monocrystal Si region comprises a thin film formed by separation by implanted oxygen.

6. A semiconductor device according to claim 1 or claim 2, wherein said monocrystal Si region comprises a thin film formed by recrystallizing a polycrystalline or amorphous Si thin film by laser annealing.

7. A semiconductor device according to claim 1 or claim 2, wherein a leakage current through said NMOS transistor and said PMOS transistor is less than 100 pA for every 1 μm of gate width.

8. A semiconductor device according to claim 1 or claim 2, wherein a crystal Si substrate is disposed underneath said insulating layer.

9. A semiconductor device according to claim 1 or claim 2, wherein the value of $V_{DD} - V_{SS}$ is greater than 10 V.

* * * * *

UNITED STATES PATENT AND TRADEMARK OFFICE
CERTIFICATE OF CORRECTION

PATENT NO. : 5,434,441
DATED : July 18, 1995
INVENTOR(S) : SHUNSUKE INOUE ET AL.

It is certified that error appears in the above-indentified patent and that said Letters Patent is hereby corrected as shown below:

On the title page, item

[56] REFERENCES CITED

Foreign Patent Documents,
"2-25821 6/1987 Japan" should read
--2-25821 6/1987 Europe Pat. Off.--.

COLUMN 3

Line 32, "illustrates of" should read --illustrate--.

COLUMN 4

Line 34, "+" should read --⊕--.

UNITED STATES PATENT AND TRADEMARK OFFICE
CERTIFICATE OF CORRECTION

PATENT NO. : 5,434,441
DATED : July 18, 1995
INVENTOR(S) : SHUNSUKE INOUE ET AL.

It is certified that error appears in the above-indentified patent and that said Letters Patent is hereby corrected as shown below:

COLUMN 7

Line 15, ":sub-" should read --sub- --.

COLUMN 9

Line 41, "$\varepsilon_{BOX}^{-1}$" should read -- $\varepsilon_{BOX}^{-1}$ --.

COLUMN 10

Line 50, "$\varepsilon_{BOX}^{-1}$" should read -- $\varepsilon_{BOX}^{-1}$ --.

COLUMN 14

Line 14, "the said" should read --said--.

Signed and Sealed this

Ninth Day of April, 1996

Attest:

BRUCE LEHMAN

Attesting Officer

Commissioner of Patents and Trademarks